(12) United States Patent
Agarwal et al.

(10) Patent No.: US 10,043,855 B1
(45) Date of Patent: Aug. 7, 2018

(54) COMPENSATING FOR PARASITIC VOLTAGE DROPS IN CIRCUIT ARRAYS

(71) Applicant: National Technology & Engineering Solutions of Sandia, LLC, Albuquerque, NM (US)

(72) Inventors: Sapan Agarwal, Dublin, CA (US); Matthew Marinella, Gilbert, AZ (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/841,670

(22) Filed: Dec. 14, 2017

Related U.S. Application Data

(60) Provisional application No. 62/513,239, filed on May 31, 2017.

(51) Int. Cl.
| | |
|---|---|
| *H01L 27/24* | (2006.01) |
| *G11C 13/00* | (2006.01) |
| *H01L 27/15* | (2006.01) |
| *G11C 5/14* | (2006.01) |
| *H01L 45/00* | (2006.01) |
| *H01L 27/32* | (2006.01) |
| *G11C 5/06* | (2006.01) |
| *H01L 49/02* | (2006.01) |

(52) U.S. Cl.
CPC .......... *H01L 27/2463* (2013.01); *G11C 5/063* (2013.01); *G11C 5/14* (2013.01); *G11C 5/147* (2013.01); *G11C 13/004* (2013.01); *G11C 13/0026* (2013.01); *G11C 13/0028* (2013.01); *G11C 13/0033* (2013.01); *G11C 13/0069* (2013.01); *H01L 27/156* (2013.01); *H01L 27/3276* (2013.01); *H01L 45/04* (2013.01); *G11C 13/0023* (2013.01); *G11C 2013/005* (2013.01); *G11C 2013/009* (2013.01); *G11C 2213/72* (2013.01); *H01L 27/2409* (2013.01); *H01L 28/20* (2013.01)

(58) Field of Classification Search
CPC ............. H01L 27/14609; H01L 27/156; H01L 27/2463; H01L 27/32; H01L 27/3241; H01L 27/3276; H01L 27/3288; H01L 28/80; H01L 29/66166; H01L 29/86; H01L 29/8615; H01L 45/00; H01L 45/04; H01L 51/50; H01L 51/52; H01L 51/5203; G11C 5/06; G11C 5/063; G11C 5/14; G11C 11/5678; G11C 11/5685
See application file for complete search history.

(56) References Cited

U.S. PATENT DOCUMENTS

| | | |
|---|---|---|
| 4,777,467 A | 10/1988 | Noel et al. |
| 7,505,348 B2 | 3/2009 | De Brosse et al. |

(Continued)

*Primary Examiner* — Eduardo A Rodela
(74) *Attorney, Agent, or Firm* — Medley, Behrens & Lewis, LLC

(57) ABSTRACT

Various technologies for improving uniformity of operation of elements in an array circuit are described herein. In an exemplary embodiment, a plurality of resistive elements are incorporated into an array circuit such that voltages developed across any two elements is substantially the same when an equal voltage is applied to energize the elements. In a crossbar array circuit that comprises a plurality of elements arranged in rows and columns, the resistance of each of the resistive elements is based upon a row or column to which the resistive element is connected.

20 Claims, 5 Drawing Sheets

(56) References Cited

U.S. PATENT DOCUMENTS

| | | | |
|---|---|---|---|
| 2003/0122759 A1* | 7/2003 | Abe | G09G 3/22 |
| | | | 345/89 |
| 2004/0001039 A1* | 1/2004 | Shino | G09G 3/2092 |
| | | | 345/100 |
| 2004/0217950 A1* | 11/2004 | Shino | G09G 3/22 |
| | | | 345/204 |
| 2008/0211750 A1 | 9/2008 | Huang et al. | |
| 2009/0079390 A1 | 3/2009 | Choi et al. | |
| 2012/0120703 A1 | 5/2012 | Chang et al. | |
| 2013/0162622 A1* | 6/2013 | Ebisuno | G09G 3/3208 |
| | | | 345/212 |

\* cited by examiner

COMPENSATING FOR PARASITIC VOLTAGE DROPS IN CIRCUIT ARRAYS

RELATED APPLICATION

This application claims priority to U.S. Provisional Patent Application No. 62/513,239, filed on May 31, 2017, and entitled "COMPENSATING FOR PARASITIC VOLTAGE DROPS IN CIRCUIT ARRAYS", the entirety of which is incorporated herein by reference.

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Array circuits are currently employed in applications such as displays, wherein array elements function as pixels of a display, and memory circuits, wherein array elements function as individual memory elements. Parasitic resistance losses due to line resistance of conductive elements in different current paths through an array may vary based in part upon differences in path length of the different current paths. In large arrays with hundreds or thousands of elements, these differences in parasitic resistance losses may be substantial. As a result, when a same voltage is applied to different terminals of the array in order to energize first and second array elements, a voltage actually developed at the first and second elements may differ. This difference in voltage may result in non-uniform array performance, device performance errors, wasteful power dissipation, and increased voltage supply requirements. For some applications, arrays may be practically limited in size (e.g., to 1,000 elements or fewer) by these limitations.

SUMMARY

The following is a brief summary of subject matter that is described in greater detail herein. This summary is not intended to be limiting as to the scope of the claims.

Technologies for compensating for parasitic voltage drops caused by line resistance of conductive elements in a circuit array are described herein. An array circuit comprises a plurality of array elements (e.g., pixel display elements, resistive memory elements, etc.) arranged in a regular pattern. The array elements are connected by conductive elements or lines that each have a low, non-zero resistance (e.g., <2Ω). The regular pattern of the array defines a first plurality of terminals and a second plurality of terminals, wherein each of the elements in the array is energized or accessed by way of a respective pair of terminals that comprises one terminal in the first plurality of terminals and one terminal in the second plurality of terminals.

In an exemplary embodiment, the array circuit further comprises a plurality of resistive components connected to terminals of the array. The plurality of resistive components are configured to cause the resistance along an energizing current path for a first element (e.g., that is energized by way of any pair of terminals that consists of a terminal in the first plurality of terminals and a terminal in the second plurality of terminals) to be approximately equal to (e.g., within 30% of, within 10% of, or within 5% of) a resistance of a second energizing current path through a second element (e.g., that is energized by way of any other pair of terminals similarly consisting of one terminal from the first group of terminals and one terminal from the second group of terminals). Since the parasitic resistance in the energizing current path between a pair of terminals may depend upon the geometry of the array, a resistive value of any of the resistive components may depend in part upon the array geometry.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
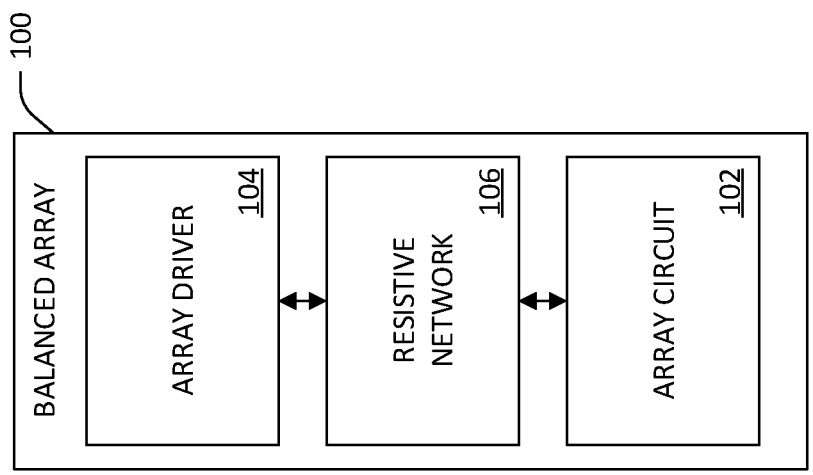
FIG. 1 is a functional block diagram of an exemplary resistance-balanced array circuit.

Various technologies pertaining to balancing array circuits to compensate for differences in parasitic resistances of various current paths are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As used herein, the term "directly connected between" is intended to mean that terminals of a particular component are electrically connected to given nodes without any other component included as part of a path between the given nodes along with the particular component. The particular component is directly connected between the given nodes when the particular component is part of a path between the given nodes, where a first terminal of the particular component is electrically connected to a first one of the given nodes, a second terminal of the particular component is electrically connected to a second one of the given nodes, and no intermediary node exists along the path. Thus, when the particular component is directly connected between the given nodes, no other component is in series with the particular component between the given nodes. By way of illustration, a resistor being directly connected between a node A and a node B is intended to mean that a first terminal of the resistor is electrically connected to the node A and a second terminal of the resistor is electrically connected to the node B.

The term "connected between" is intended to encompass both a particular component being directly connected between given nodes and the particular component being part of a path between the given nodes such that one or more other components are also part of the path between the given nodes. When connected between given nodes, the particular component is part of a path between the given nodes that may include one or more intermediary nodes. According to an example, when connected between the given nodes, the particular component can be part of a path between the given nodes that includes a maximum of two intermediary nodes. In accordance with another example, when connected between the given nodes, the particular component can be part of a path between the given nodes that includes a maximum of one intermediary node. Pursuant to an illustration, a resistor being connected between a node A and a node B is intended to include the resistor being directly connected between the node A and the node B as well as configurations such as a first terminal of the resistor being electrically connected to the node A, a second terminal of the resistor being electrically connected to an intermediary node C, a first terminal of a capacitor being electrically connected to the intermediary node C, and a second terminal of the capacitor being electrically connected to the node B.

Furthermore, as used herein with respect to array circuits in various configurations, the term "energizing current path" is intended to mean a path by which an electrical current flows through the array circuit, wherein the electrical current passes into a first terminal of the array circuit, through only a targeted single element in the array circuit, and then out of a second terminal of the array circuit.

Moreover, it is to be appreciated that any component described herein can be replaced by an equivalent network of components. For instance, resistors, capacitors, or inductors described herein can be replaced by equivalent resistive, capacitive, or inductive networks. It is also to be understood that a component or system may be localized on a single device or distributed across several devices. Additionally, as used herein, the term "exemplary" is intended to mean serving as an illustration or example of something, and is not intended to indicate a preference.

Referring now to the drawings, FIG. 1 illustrates an exemplary balanced array circuit system 100. The system 100 includes an array circuit 102, an array driver 104, and a resistive network 106. The array circuit 102 is a circuit comprising a plurality of elements arranged in a regular pattern, where the array circuit 102 is configured to perform various functions. In one example, the array circuit 102 comprises an array of display elements, each of the display elements making up at least part of a pixel in a display. In another example, the array circuit 102 comprises an array of memory elements, each of the memory elements corresponding to a different address in a memory system. In various embodiments, the elements of the array circuit 102 may be individually energized, or energized in one or more groups, in order to perform the functions associated with the array circuit 102. For example, in embodiments where the array circuit 102 comprises a plurality of display pixel elements, the elements are energized in order to cause the array circuit 102 to display an image. In another example, where the array circuit 102 comprises a plurality of memory elements, the elements are energized in order to read or write data stored by the elements.

The array driver 104 is a system configured to energize elements of the array circuit 102 in order to drive the array circuit 102 to perform the various functions associated with the array circuit 102. The array driver 104 drives the array circuit 102 by energizing the elements of the array circuit 102 one at a time or in groups. In a conventional array circuit system, an array driver energizes individual elements of an array circuit by way of applying voltages between terminals of the array circuit, where each element of the array circuit is uniquely energized by a respective pair of terminals of the array circuit.

In the balanced array circuit system 100, the resistive network 106 is connected between the array circuit 102 and the array driver 104. The resistive network 106 is configured to compensate for parasitic resistances in the array circuit 102, such that a same voltage applied at any two pairs of terminals, each pair of terminals corresponding to any element in the array circuit 102, causes a voltage developed at the elements corresponding to the pairs of terminals to be substantially equal (e.g., within 30% of one another, within 10% of one another, or within 1% of one another). For example, the resistive network 106 may be configured to cause the resistance of energizing current paths in the array 100 to be substantially equal (e.g., within 30% of one another, within 10% of one another, or within 1% of one another).

In exemplary embodiments, the array circuit 102, the array driver 104, and the resistive network 106 are implemented as discrete circuits (e.g., separate integrated circuits). In other embodiments, the array circuit 102, the array driver 104, and the resistive network 106 are implemented as a single integrated circuit device. In still other embodiments, the array circuit 102 and the array circuit driver 104 are implemented as discrete circuits and the resistive network 106 is implemented as part of one or both of the array circuit 102 or the array circuit driver 104. It is to be understood that other embodiments are contemplated as being within the scope of the present disclosure.

In various embodiments, the plurality of elements of the array circuit 102 are arranged in a regular pattern to define a first plurality of terminals and a second plurality of terminals. In an example, an array circuit that comprises a crossbar array includes a first plurality of terminals connected to rows of the crossbar array and a second plurality of terminals that are connected to columns of the crossbar array. In embodiments, each of the plurality of elements that make up the array circuit 102 is energized by way of a respective pair of terminals consisting of one terminal in the first plurality of terminals and one terminal in the second plurality of terminals. The regular pattern of the elements of the array circuit 102 defines an addressing scheme by which elements of the array may be energized in order to perform various functions. For example, in embodiments wherein the array circuit comprises a crossbar array, each element of the array circuit is uniquely addressable by way of a pair of terminals consisting of one row terminal and one column terminal. Thus, each of the elements is addressable by a coordinate pair $(r_j, c_k)$, where $r_j$ represents a jth row and $c_k$ represents a kth column. The array circuit 102 may include substantially any number of elements. In an example, the array circuit 102 is an array of 10,000 elements arranged in 100 rows by 100 columns. In another example, the array circuit is an array of 1,000,000 elements arranged in 1,000 rows and 1,000 columns.

Figure 2:
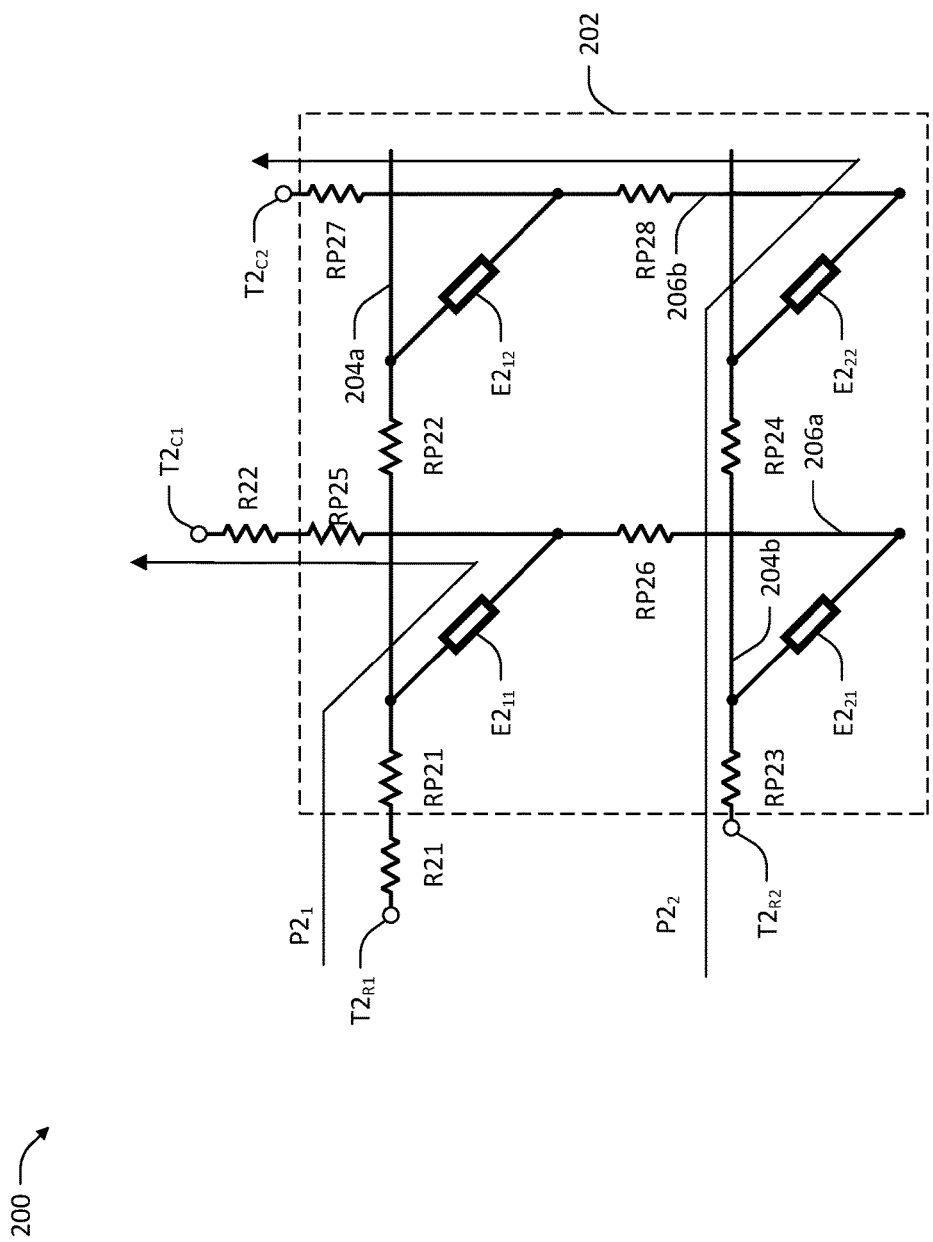
FIG. 2 is a circuit schematic that illustrates an exemplary balanced array circuit.

For example, and referring now to FIG. 2, an exemplary balanced array 200 of elements arranged in a regular pattern is illustrated. The balanced array 200 comprises an array circuit 202 and balancing resistors R21-R22. The array circuit 202 comprises four elements $E2_{11}$, $E2_{12}$, $E2_{21}$, $E2_{22}$ arranged in a crossbar pattern, where $E2_{jk}$ refers to the element in the jth row and the kth column of the array circuit 202. The elements $E2_{11}$-$E2_{22}$ of the array circuit 202 are each connected to one of two crossbar rows 204a, 204b and one of two crossbar columns 206a, 206b, such that each of the elements $E2_{11}$-$E2_{22}$ is uniquely identified by the crossbar row and crossbar column to which it is connected. Specifically, the first element $E2_{11}$ is connected to the first crossbar row 204a and the first crossbar column 206a; the second element $E2_{12}$ is connected to the first crossbar row 204a and the second crossbar column 206b; the third element $E2_{21}$ is connected to the second crossbar row 204b and the first crossbar column 206a; and the fourth element $E2_{22}$ is connected to the second crossbar row 204b and the second crossbar column 206b.

The array 200 comprises a first group of terminals connected to the crossbar rows 204a, 204b. The first group of terminals includes a first terminal $T2_{R1}$ connected to crossbar row 204a and a second terminal $T2_{R2}$ connected to crossbar row 204b. The array 200 further comprises a second group of terminals connected to the crossbar columns 206a, 206b. The second group of terminals includes a third terminal $T2_{C1}$ connected to crossbar column 206a and a fourth terminal $T2_{C2}$ connected to crossbar column 206b. The four elements $E2_{11}$-$E2_{22}$ of the array circuit 202 are each energized by way of a respective pair of terminals that includes one of the row terminals $T2_{R1}$, $T2_{R2}$ and one of the column terminals $T2_{C1}$, $T2_{C2}$. To energize the first element $E2_{11}$, a voltage is established between terminals $T2_{R1}$ and $T2_{C1}$ (e.g., applied to the terminals $T2_{R1}$ and $T2_{C1}$ by an array circuit driver), causing a current to flow from terminal $T2_{R1}$ along path $P2_1$, which extends along the first crossbar row 204a, through the first balancing resistor R21, through the first element $E2_{11}$ to the first crossbar column 206a, through the second balancing resistor R22 to terminal $T2_{C1}$. Similarly, to energize the second element $E2_{12}$, a voltage is established between terminals $T2_{R1}$ and $T2_{C2}$. To energize the third element $E2_{21}$, a voltage is established between terminals $T2_{R2}$ and $T2_{C1}$. Finally, to energize the fourth element $E2_{22}$, a voltage is established between terminals $T2_{R2}$ and $T2_{C2}$. The elements $E2_{11}$-$E2_{22}$ can be configured to prevent unintentional leakage currents through elements not desirably energized. For example, the elements $E2_{12}$-$E2_{22}$ can be configured such that when element $E2_{11}$ is energized by way of terminals $T2_{R1}$ and $T2_{C1}$, substantially no current flows from $T2_{R1}$ to $T2_{C1}$ except by the path $P2_1$. In an exemplary embodiment, each of the elements $E2_{11}$-$E2_{22}$ comprises a diode that allows current to pass when the voltage exceeds a threshold through the elements $E2_{11}$-$E2_{22}$ (e.g., in current path $P2_1$ only element $E2_{11}$ will see a voltage above the threshold allowing current to flow through $E2_{11}$ only).

FIG. 2 further depicts parasitic resistances RP21-RP28 in the array circuit 202 along the crossbar rows 204a, 204b and the crossbar columns 206a, 206b. As shown in FIG. 2, along each conductive path in the array circuit 202 there is a parasitic resistance $R_p$ resulting from a resistance of the conductive elements (e.g., circuit board traces, conductive wires, etc.) that make up the conductive paths. For example, along crossbar row 204a there is a first parasitic resistance RP21 along the conductive path between the first balancing resistor R21 and the first array element $E2_{11}$, and a second parasitic resistance RP22 along the conductive path between the first array element $E2_{11}$ and the second array element $E2_{12}$. Similarly, along crossbar row 204b there is a parasitic resistance RP23 along the conductive path between the second row terminal $T2_{R2}$ and the third array element $E2_{21}$, and another parasitic resistance RP24 along the conductive path between the third array element $E2_{21}$ and the fourth array element $E2_{22}$. Additional parasitic resistances are found along the first crossbar column 206a: a parasitic resistance RP25 between the second balancing resistor R22 and the first array element $E2_{11}$ and another parasitic resistance RP26 between the first array element $E2_{11}$ and the third array element $E2_{21}$. Further parasitic resistances are found along the second crossbar column 206b: parasitic resistance RP27 between the second column terminal $T2_{C2}$ and the second array element $E2_{12}$ and parasitic resistance RP28 between the second array element $E2_{12}$ and the fourth array element $E2_{22}$.

The parasitic resistances RP21-RP28 in the array circuit 202 can cause voltages developed across each of the elements $E2_{11}$-$E2_{22}$ to differ for a same applied terminal voltage, even where the resistance value of each of the parasitic resistances RP21-RP28 is a same resistance $R_p$. For example, suppose the balancing resistors R21, R22 were short-circuited in the diagram shown in FIG. 2. In the absence of balancing resistors R21, R22, if a voltage V is applied between the first row terminal $T2_{R1}$ and the first column terminal $T2_{C1}$ in order to energize the first element $E2_{11}$, a total resistance along a path $P2_1$ from the first row terminal $T2_{R1}$, through the first element $E2_{11}$, and then to the first column terminal $T2_{C1}$ is $(2R_p+R_e)$ where $R_e$ is a resistance of the elements $E2_{11}$-$E2_{22}$. By contrast, if the same voltage V is applied between the second row terminal $T2_{R2}$ and the second column terminal $T2_{C2}$ to energize the fourth element $E2_{22}$, a total resistance along a path $P2_2$ from the terminal $T2_{R2}$, along the second crossbar row 204b, through the fourth element $E2_{22}$, and along the second crossbar column 206b to the terminal $T2_{C2}$ is $(4R_p+R_e)$. By virtue of the different resistances of the paths $P2_1$ and $P2_2$, a different voltage will be developed across elements $E2_{11}$ and $E2_{22}$, despite the same voltage V being applied to their respective pairs of terminals.

The balancing resistors R21, R22 are configured to balance the total resistance seen along energizing current paths through the elements $E2_{11}$-$E2_{22}$, so that a voltage developed across any of the elements $E2_{11}$-$E2_{22}$ is substantially the same (e.g., within 30%, within 10%, or within 1%) as the voltage developed across any other of the elements $E2_{11}$-$E2_{22}$ when a same energizing voltage is applied at the elements' respective terminals. Hence, in the exemplary balanced array 200 the balancing resistors R21, R22 are each configured to have a resistance equal to the parasitic resistance $R_p$ of the parasitics RP21-RP28. The resistance through the path $P2_1$ is then $(R21+RP21+RP25+R22)=4R_p$, and the resistance through the path $P2_2$ is $(RP23+RP24+RP28+RP27)=4R_p$. Where the parasitic resistances RP21-RP28 have the same resistance $R_p$, the resistance along current paths through the circuit elements $E2_{11}$-$E2_{22}$ are substantially equalized. It is to be understood that there may be some variation in resistance values of the parasitic resistances RP21-RP28 due to manufacturing variations or other factors. In embodiments wherein resistance values of the parasitic resistances RP21-RP28 vary, balancing resistors R21, R22 having the value $R_p$ may still provide an improvement in voltage uniformity across the elements $E2_{11}$-$E2_{22}$, even though a total resistance along each of the current paths through the circuit elements $E2_{11}$-$E2_{22}$ may not be equal.

In exemplary embodiments, resistance values of various balancing resistors are determined based upon geometry of the array circuit. By way of example, in a crossbar array circuit that comprises elements arranged in rows and columns, resistance values of balancing resistors are based upon column and row numbers of terminals to which the balancing resistors are attached.

Figure 3:
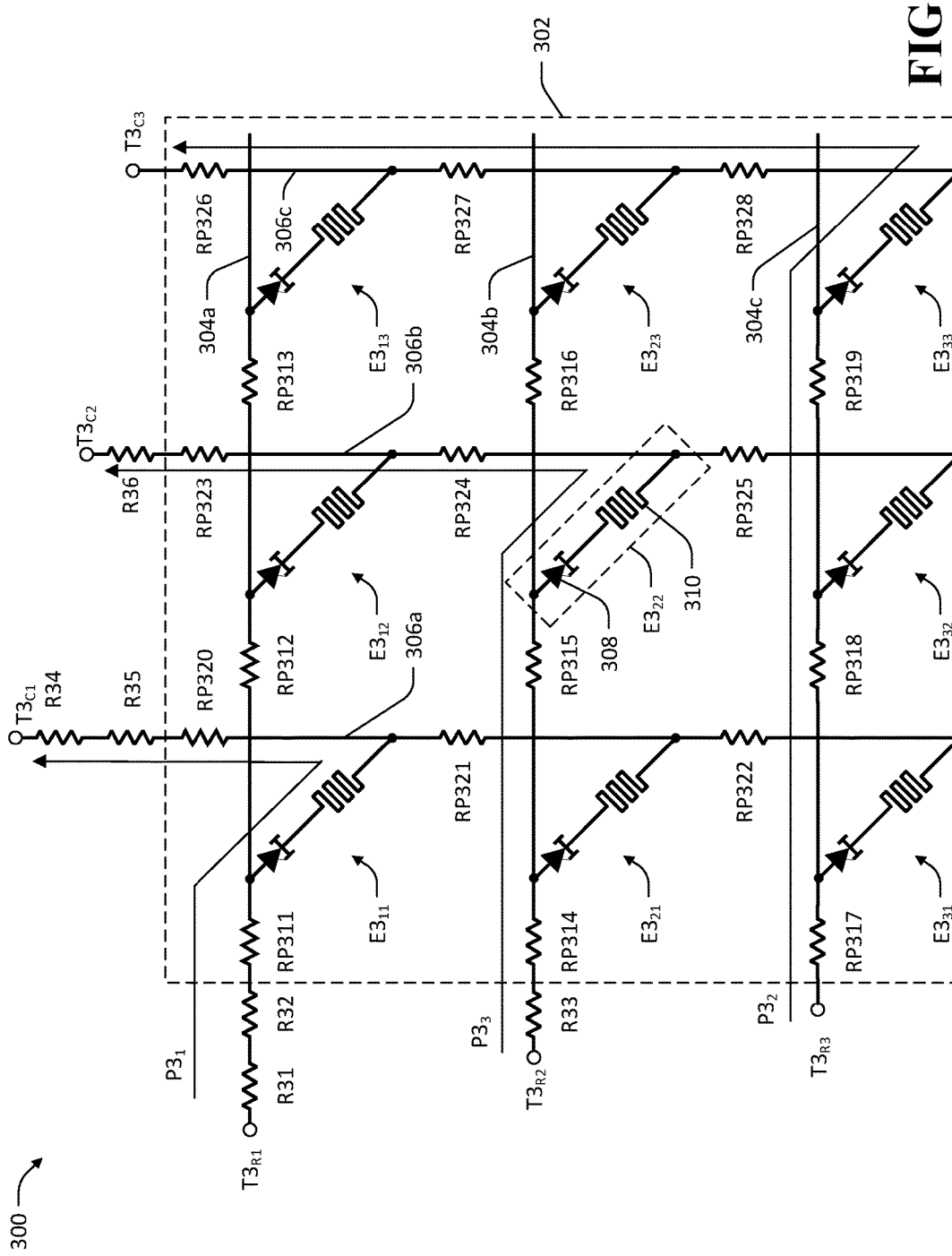
FIG. 3 is a circuit schematic that illustrates another exemplary balanced array circuit.

For example, and referring now to FIG. 3, an exemplary resistance-balanced 3×3-element resistive memory array 300 is illustrated. The array 300 includes an array circuit 302 and a network of balancing resistors R31-R36 that are configured to substantially equalize the resistance of current paths through the array circuit 302. The array circuit 302 comprises nine elements $E3_{11}$-$E3_{33}$, arranged in a 3×3 crossbar pattern, where $E3_{jk}$ refers to the element in the jth row and kth column of the array circuit 302. The elements $E3_{11}$-$E3_{33}$ of the array circuit 302 are arranged in three rows 304a-304c and three columns 306a-306c. Each of the elements $E3_{11}$-$E3_{33}$ is connected to one of the crossbar rows 304a-304c and one of the crossbar columns 306a-306c as follows; elements $E3_{11}$, $E3_{12}$, $E3_{13}$ connected to crossbar row 304a; elements $E3_{21}$, $E3_{22}$, $E3_{23}$ connected to crossbar row 304b; elements $E3_{31}$, $E3_{32}$, $E3_{33}$ connected to crossbar row 304c; elements $E3_{11}$, $E3_{21}$, $E3_{31}$ connected to crossbar column 306a; elements $E3_{12}$, $E3_{22}$, $E3_{32}$ connected to crossbar column 306b; and elements $E3_{13}$, $E3_{23}$, $E3_{33}$ connected to crossbar column 306c. The rows 304a-304c of the crossbar array 300 are accessed by way of terminals $T3_{R1}$, $T3_{R2}$, and $T3_{R3}$, respectively, whereas columns 306a-306c are accessed by way of terminals $T3_{C1}$, $T3_{C2}$, and $T3_{C3}$, respectively. Thus, each of the elements $E3_{11}$-$E3_{33}$ can be individually energized by applying a voltage between one terminal selected from the row terminals $T3_{R1}$-$T3_{R3}$ and another terminal selected from the column terminals $T3_{C1}$-$T3_{C3}$.

The elements $E3_{11}$-$E3_{33}$ of the exemplary resistive memory array 300 each comprise a diode or bidirectional access device that only allows current to flow when a voltage developed across the element is above a threshold voltage (e.g., diode 308 of element $E3_{22}$), and a resistive memory element (e.g., resistive memory element 310 of element $E3_{22}$). The resistive memory elements of the elements $E3_{11}$-$E3_{33}$ of the array 300 each have a resistance that is dependent upon voltages applied across the resistive memory elements. To "write" data to a resistive memory element, a voltage above a write threshold is applied across a resistive memory element, and its resistance changes to a new value. The new value of the resistance is therefore indicative of the voltage above the write threshold having been applied to the resistive memory element. In order to "read" the resistive memory element, a voltage below the write threshold is applied to the resistive memory element, and a resulting current flow identified in order to determine a resistance of the resistive memory element.

Further depicted in FIG. 3 are resistors RP311-RP328 that represent parasitic resistances along conductive paths in the array circuit 302. For example, FIG. 3 depicts parasitic resistances RP311-RP313 along the first crossbar row 304a, parasitic resistances RP314-RP316 along the second crossbar row 304b, parasitic resistances RP317-RP319 along crossbar row 304c, parasitic resistances RP320-RP322 along crossbar column 306a, parasitic resistances RP323-RP325 along crossbar column 306b, and parasitic resistances RP326-RP328 along crossbar column 306c.

The array 300 further comprises balancing resistors R31-R36 that are configured to substantially equalize resistance along current paths in the array circuit 302 when the elements $E3_{11}$-$E3_{33}$ are energized. In an exemplary embodiment wherein each of the parasitic resistances RP311-RP328 of the array circuit 302 has substantially the same resistance value, a configuration of the balancing resistors R31-R36 is based upon the geometry of the array circuit 302. By way of example, in the array circuit 302, assume none of the diodes of the elements $E3_{11}$-$E3_{33}$ are operating in reverse breakdown, and thus that no leakage current flows through elements other than the element being energized, and that the parasitic resistances RP311-RP328 have the same parasitic resistance value $R_p$. In the absence of balancing resistors R31-R36, a maximum resistance of energizing current paths through the array circuit is seen along path $P3_2$, equivalent to $6R_p$ for parasitic resistances RP317, RP318, RP319, RP328, RP327, and RP326. Thus, in order to equalize the resistance of energizing current paths through the array circuit 302, the balancing resistors R31-R36 are configured to cause the resistance of each of the paths to approximately equal $6R_p$.

In exemplary embodiments, a value of a balancing resistor required to substantially equalize the resistance of a current path through an element in the array circuit 302 to the resistance $6R_p$ of the path $P3_2$ depends upon a number of rows and/or number of columns that that element is away from the element $E3_{33}$. For example, elements $E3_{12}$, $E3_{22}$, and $E3_{32}$ in the second column 306b are all one column away from element $E3_{33}$ in the array circuit 302, and so the second column terminal $T3_{C2}$ is balanced by a resistance value of $R_p$, represented by resistor R36. Elements $E3_{11}$, $E3_{21}$, and $E3_{31}$ in the first column 306a are two columns away from element $E3_{33}$, and thus the first column terminal $T3_{C1}$ is balanced by a resistance value of $2R_p$, represented by resistors R34 and R35.

Where the parasitic resistance of conductive paths (e.g., RP311-RP328) in an array circuit is substantially the same (e.g., the parasitic resistance of each conductive path is within 30% of the parasitic resistance of any other conductive path), the resistance of a balancing resistive component is based upon a number of rows and/or a number of columns in the array circuit. By way of an example, in an array circuit comprising a plurality of rows and columns, a balancing resistance connected to a given row terminal is based upon a distance of the given row terminal away from the element with the greatest parasitic resistance along its energizing current path.

Figure 4:
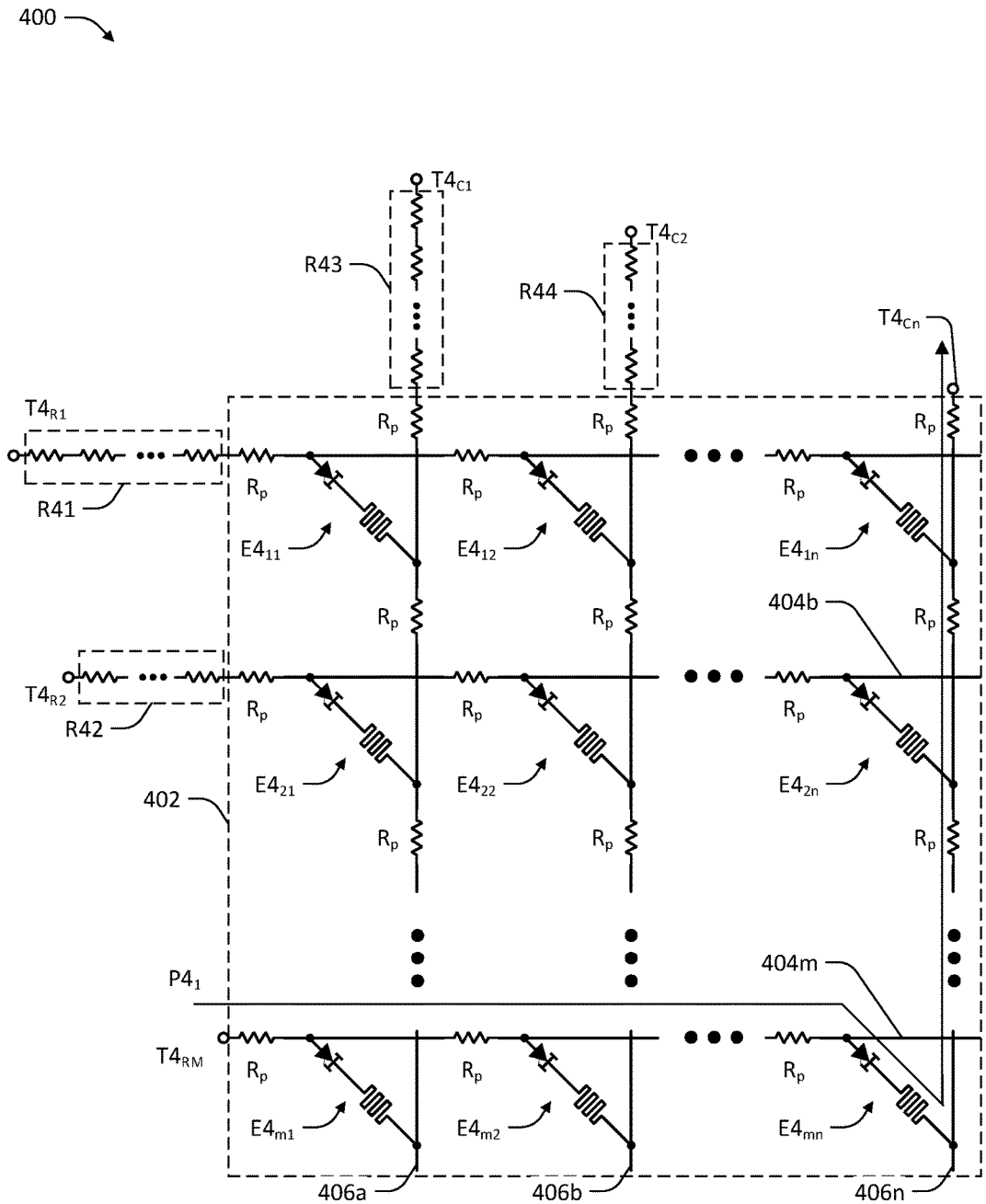
FIG. 4 is a circuit schematic illustrating still another exemplary balanced array circuit.

For example, and referring now to FIG. 4, a balanced m×n array circuit 400 is shown. The balanced array circuit 400 comprises an m×n array circuit 402 and a plurality of resistive components R41, R42, R43, R44. The array circuit 402 comprises a plurality of m times n elements $E4_{11}$-$E4_{mn}$ (shown in the exemplary embodiment in FIG. 4 as resistive memory circuits), where $E4_{jk}$ refers to an element in the jth row and the kth column of the array circuit 402. The elements $E4_{11}$-$E4_m n$ are arranged in an array of m rows 404a-404m and n columns 406a-406n, and separated by parasitic resistances $R_p$, as described above with respect to FIGS. 2 and 3, mutatis mutandis. Among the energizing current paths in the array circuit 402, the path of greatest resistance $P4_1$ has a parasitic resistance of $(m+n)R_p$, where $mR_p$ is seen along the nth column 406n from the element $E4_{mn}$ to the nth column terminal $T4_{Cn}$, and $nR_p$ is seen along the mth row 404m from the mth row terminal $T4_{Rm}$ to the element $E4_{mn}$. Hence, a resistance along an energizing current path for a given element in the array circuit 402 is based upon a location (row, column) of the element within the array circuit 402.

Accordingly, resistance values of balancing resistive components R41-R44 connected to terminals $T4_{R1}$, $T4_{R2}$, $T4_{C1}$, and $T4_{C2}$, respectively, are based upon the locations of their respective rows and columns within the array circuit 402. In general, a resistance of a balancing resistive component for a jth row of the array circuit 402 is given by $(m-j)R_p$. Similarly, a resistance of a balancing resistive component for a kth column of the array circuit 402 is given by $(n-k)R_p$. Hence, the resistive component R41 has a resistance of $(m-1)R_p$, the resistive component R42 has a resistance of $(m-2)R_p$, etc. Similarly, the resistive component R43 has a resistance of $(n-1)R_p$, the resistive component R44 has a resistance of $(n-2)R_p$, etc.

Figure 5:
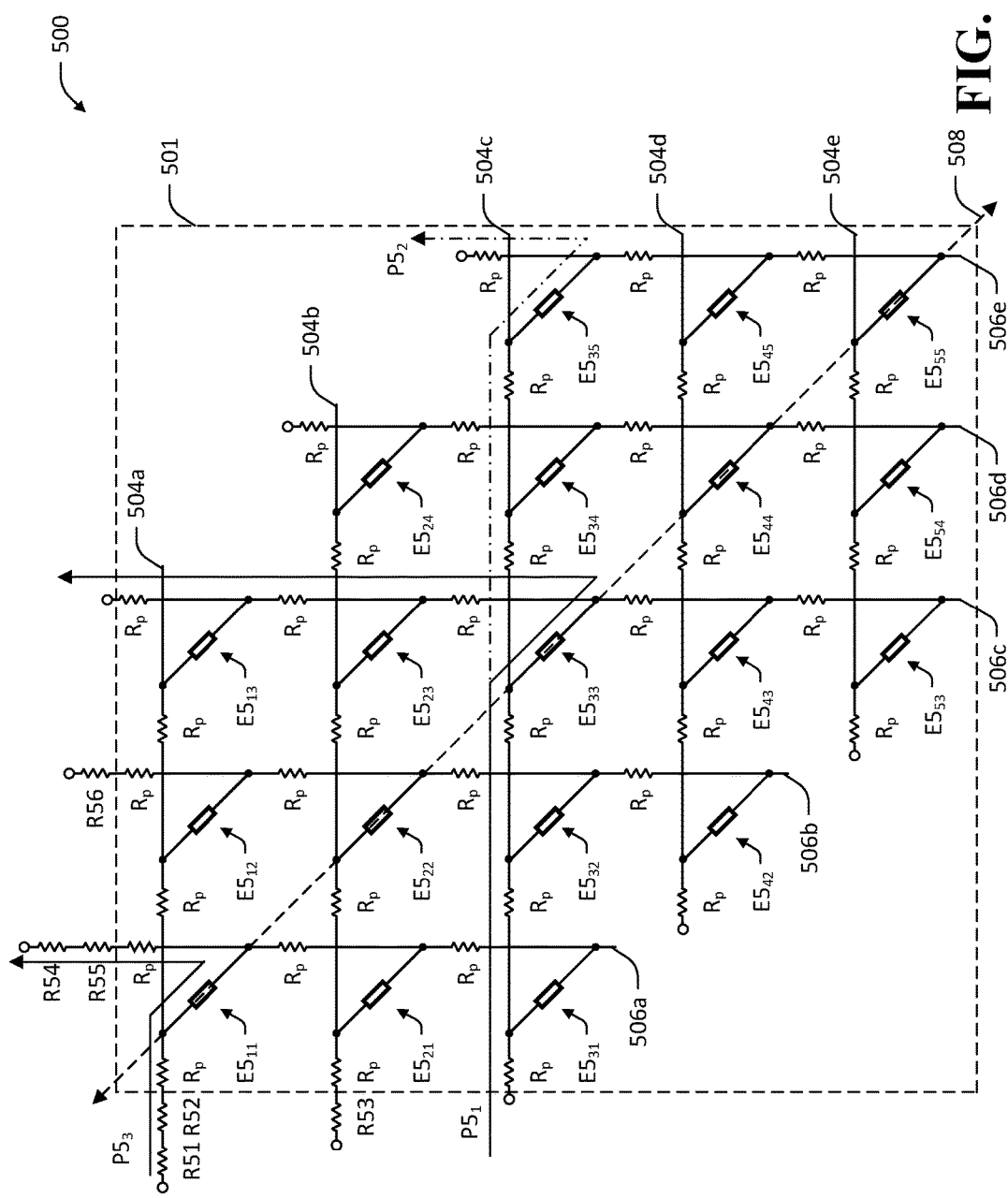
FIG. 5 is a circuit schematic illustrating an exemplary balanced array circuit in a diagonally tiled configuration.

In various embodiments, the elements of an array circuit that comprises a plurality of rows and a plurality of columns are arranged in a non-rectangular pattern to substantially equalize the parasitic voltage drop through energizing current paths in the array. For example, and referring now to FIG. 5, an exemplary balanced array circuit 500 is shown, wherein the balanced array circuit 500 comprises an array circuit 502 and balancing resistors R51-R56. The array circuit 502 comprises a plurality of elements $E5_{11}$-$E5_{55}$ arranged in five rows 504a-504e and five columns 506a-506e, where element $E5_{jk}$ is the element in the jth row and kth column. As in the exemplary arrays 200, 300, 400, the rows 504a-504e of the balanced array 500 are energized by way of a plurality of row terminals $T5_{R1}$-$T5_{R5}$, and the columns 506a-506e are energized by way of a plurality of column terminals $T5_{C1}$-$T5_{C5}$. The elements $E5_{11}$-$E5_{55}$ are separated from one another along rows 504a-504e and columns 506a-506e by parasitic resistances $R_p$.

Rather than being a square array, the array circuit 502 is arranged in a zig-zag pattern that is tiled along a diagonal 508 extending from the upper-leftmost element $E5_{11}$ to the lower-rightmost element $E5_{55}$. Thus, in exemplary embodiments one or more of the rows 504a-504e does not have an element in all of the columns 506a-506e. By way of example, the row 504a of the array circuit 502 comprises elements $E5_{11}$, $E5_{12}$, $E5_{13}$ in columns 506a, 506b, 506c, respectively, but does not have elements in columns 506d, 506e. Similarly, in other exemplary embodiments one or more of the columns 506a-506e does not have an element in all of the rows 504a-504e. In an example, column 506e comprises elements $E5_{35}$, $E5_{45}$, $E5_{55}$ in rows 504c, 504d, 504e, respectively, but does not have elements in rows 504a, 504b.

The diagonal tiling of elements in an array circuit (e.g., as shown in the array circuit 502) can be extended indefinitely. For example, the tiling may be extended to fill the entirety of an allocated space for the array circuit on a printed circuit board. By way of example, the array circuit 502 can be conceptually described as a three-times tiling of a 3×3 element unit cell, wherein the unit cell is translated one row down and one column to the right in each successive tiling. In the array circuit 502, the initial 3×3 element unit cell consists of the elements $E5_{11}$, $E5_{12}$, $E5_{13}$, $E5_{21}$, $E5_{22}$, $E5_{23}$, $E53_{31}$, $E5_{32}$, $E5_{33}$. In the second iteration of the tiling, this 3×3 unit cell is translated down one row and to the right one column. The translated unit cell overlaps with $E5_{22}$, $E5_{23}$, $E5_{32}$, and $E5_{33}$ and for these locations in the unit cell, no additional elements are added. The translated unit cell does not overlap with initial unit cell in column 506d or row 504d, and additional elements $E5_{24}$, $E5_{34}$, $E5_{42}$, $E5_{43}$, and $E5_{44}$ are added to the tiling in those locations. In the third iteration of the tiling, the unit cell is again translated down one row and to the right one column, thereby yielding additional elements $E5_{35}$, $E54_{45}$, $E5_{53}$, $E55_{54}$, and $E5_{55}$. From the foregoing it is apparent that the tiling can be extended as many times as desired, and that the initial unit cell that is to be successively tiled may be of substantially any size.

The resistors R51, R52 are connected in series between terminal $T5_{R1}$ and element $E5_{11}$. Resistor R53 is connected between terminal $T5_{R2}$ and element $E5_{21}$. Resistors R54, R55 are connected in series between terminal $T5_{C1}$ and element $E5_{11}$. Resistor R56 is connected between terminal $T5_{C2}$ and element $E5_{12}$. The arrangement of the elements $E5_{11}$-$E5_{55}$ and the resistance values of the balancing resistors R51-R56 are configured to cause a resistance along energizing current paths in the array circuit 502 to be substantially equal. For example, by virtue of the different number of elements in columns 506c and 506e, an energizing current path $P5_1$ through element $E5_{33}$ sees a same parasitic resistance of 6R, as energizing current path $P5_2$ through element $E5_{35}$. In another example, an energizing current path $P5_3$ through element $E5_{11}$ passes through resistors R51, R52, R54, R55, each having a resistance substantially equal to the resistance $R_p$ of the parasitic resistances, and two parasitic resistances $R_p$, for a total resistance $6R_p$. A tiled configuration of elements in an array circuit, such as the array circuit 502, can improve equalization of resistance among energizing current paths in an array circuit (e.g., as compared to a square array) while requiring only a relatively small number of balancing resistors. In other embodiments, a tiled configuration of elements in an array circuit may be arranged such that parasitic voltage drops caused by parasitic resistances are substantially equalized among energizing current paths in the array circuit, without requiring the use of balancing resistors.

In some instances, balancing resistors are depicted in the various circuit schematics described herein as being a plurality of resistors in series in order to facilitate understanding of certain concepts. However, it is to be understood that a plurality of resistors in series could be replaced by a single resistor or an equivalent network of resistors having a same resistance value as a sum of the resistance values of the series resistors. By way of example, in the balanced array 300 depicted in FIG. 3, resistors R31, R32 could be replaced by a single resistor having a resistance value equal to the sum of the resistance of R31 and the resistance of R32. In another example, the resistors R31, R32 could be replaced by a network of substantially any number of resistors that has an equivalent resistance to current flow from $T3_{R1}$ to parasitic resistance RP311 that is equal to the sum of the resistance of R31 and the resistance of R32.

In various embodiments, the parasitic resistance of each conductive path in the array circuits 202, 302, 402, 502 is substantially the same (e.g., each of the parasitic resistances $R_p$ is within ±30% of a nominal base value R, within ±10% of R, or within ±1% of R). In other embodiments the parasitic resistance of each conductive path in the array circuit 202 varies according to a probability distribution. For example, the parasitic resistance $R_p$ of each conductive element in the array circuit 202 may vary according to a normal distribution around a mean value R, where the standard deviation of the distribution is as high as 0.5R. Since there may be unknown variations in parasitic resistance of conductive paths in an array circuit, balancing resistors need not perfectly compensate for differences in resistance between energizing current paths. In exemplary embodiments, the balancing resistors may be configured to cause a total resistance seen looking into any pair of terminals consisting of one row terminal and one column terminal of a crossbar array circuit to be within 10% of a base value.

In various exemplary embodiments, resistance values of conductive elements in an array circuit are dependent upon characteristics of a process used to manufacture the array circuit. For example, in embodiments wherein an array circuit is an integrated circuit (IC) manufactured according to any of various conventional IC manufacturing methods (e.g., atomic layer deposition, chemical/physical vapor deposition, focused ion beam fabrication, etc.), variations in resistance of conductive elements in the array circuit may be correlated based upon various parameters of the manufacturing process. In such embodiments, resistive elements serving as balancing resistors may be made using the same processes as used to manufacture the conductive elements in the array circuit in order to at least partially compensate for correlated variations in resistances of the conductive elements resulting from the manufacturing process.

In various exemplary embodiments, the structure of the array may vary or multiple elements may be driven at once. In these cases the values of the compensating resistors can be adjusted to ensure that voltage seen across each element is substantially the same as the intended voltage for that element (e.g., within ±30% of a nominal base value V, within ±10% of V, or within ±1% of V).

What has been described above includes examples of one or more embodiments. It is, of course, not possible to describe every conceivable modification and alteration of the above devices or systems for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
    an array circuit comprising four elements arranged in a regular pattern such that the array circuit comprises a first group of terminals that comprises first and second terminals, and a second group of terminals that comprises third and fourth terminals, each of the elements energized by way of a respective pair of terminals, each pair of terminals comprising a terminal in the first group of terminals and a terminal in the second group of terminals; and
    a plurality of resistive components connected to the array circuit, the resistive components comprising a first resistive component connected to the first terminal and a second resistive component connected to the second terminal, the first resistive component having a higher resistance than the second resistive component, the plurality of resistive components configured such that for each of the elements in the array circuit, when a voltage is applied to the respective pair of terminals by way of which the element is energized, a voltage drop across the element is within 30% of a voltage drop across any other element when the same voltage is applied to the respective pair of terminals by way of which the other element is energized.

2. The system of claim 1, wherein the voltage drop across the element is within 10% of the voltage drop across the other element.

3. The system of claim 1, wherein the voltage drop across the element is within 1% of the voltage drop across the other element.

4. The system of claim 1, wherein the regular pattern comprises a rectangular pattern comprising two columns and two rows of elements.

5. The system of claim 1, wherein a resistance of a first conductive path through a first element in the array circuit is within 30% of a resistance of a second conductive path through a second element in the array circuit.

6. The system of claim 1, the array circuit comprising 10,000 elements.

7. The system of claim 6, wherein the 10,000 elements of the array are arranged in a pattern comprising 100 rows and 100 columns.

8. The system of claim 7, wherein a resistance value of a resistive component in the plurality of resistive components is based upon a row or column to which the resistive component is connected.

9. The system of claim 1, wherein the array circuit comprises a crossbar array.

10. The system of claim 1, wherein the regular pattern comprises a rectangular pattern tiled along a diagonal direction of the rectangle.

11. The system of claim 1, wherein the elements are memory elements.

12. The system of claim 1, wherein the elements are display elements.

13. A resistance-balanced circuit array, comprising:
    an array comprising four array elements arranged in a pattern of two rows and two columns, each of the four array elements energized by way of a voltage applied between a respective pair of terminals, each pair of terminals comprising one row terminal and one column terminal; and
    a resistive network connected to the array circuit, the resistive network comprising a first resistor connected to a first column terminal and a second resistor connected to a second column terminal, the first resistor having a greater resistance than the second resistor, the resistive network configured so that a first voltage drop across a first element is within 30% of a second voltage drop across a second element when a same voltage is applied to the respective pairs of terminals for the first element and the second element.

14. The resistance-balanced circuit array of claim 13, wherein the first voltage drop is within 10% of the second voltage drop.

15. The resistance-balanced circuit array of claim 13, wherein the first voltage drop is within 1% of the second voltage drop.

16. The resistance-balanced circuit array of claim 13, the array comprising 1,000,000 elements.

17. The resistance-balanced circuit array of claim 13, wherein a resistance value of a resistive component in the plurality of resistive components is based upon a row or column to which the resistive component is connected.

18. The resistance-balanced circuit array of claim 13, the elements arranged in a tiled pattern defined by a successive tiling of a rectangular unit cell pattern of elements.

19. The resistance-balanced circuit array of claim 13, wherein the elements are resistive memory elements.

20. A system comprising:
an array comprising four array elements, the elements arranged in a two-by-two pattern comprising two rows and two columns, each element in the array energized by way of a respective pair of terminals, each pair of terminals comprising a row terminal and a column terminal; and
a plurality of resistive elements, each of the resistive elements connected to one of a row terminal or a column terminal, the plurality of resistive elements configured such that for each of the elements in the array circuit, when a voltage is applied to its respective pair of terminals, a voltage drop across the element is within 30% of a voltage drop across any other element when the same voltage is applied to the respective pair of terminals of the other element, the plurality of resistive elements comprises:
a first resistive element connected to a first terminal, the first terminal being one of the two row terminals or the two column terminals; and
a second resistive element connected to a second terminal, the second terminal being another of the two row terminals or the two column terminals, the second resistive element having a greater resistance than the first resistive element.

* * * * *